(12) United States Patent
Lin et al.

(10) Patent No.: US 9,281,339 B1
(45) Date of Patent: Mar. 8, 2016

(54) METHOD FOR MOUNTING CHIP ON PRINTED CIRCUIT BOARD

(71) Applicant: SunASIC Technologies, Inc., New Taipei (TW)

(72) Inventors: Chi-Chou Lin, New Taipei (TW); Zheng-Ping He, New Taipei (TW)

(73) Assignee: Sunasic Technologies, Inc., New Taipei (TW)

( * ) Notice: Subject to any disclaimer, the term of this patent is extended or adjusted under 35 U.S.C. 154(b) by 0 days.

(21) Appl. No.: 14/488,814

(22) Filed: Sep. 17, 2014

(51) Int. Cl.
*H01L 27/146* (2006.01)
*H01L 21/48* (2006.01)
*H01L 23/538* (2006.01)

(52) U.S. Cl.
CPC .......... *H01L 27/1469* (2013.01); *H01L 27/146* (2013.01); *H01L 21/4857* (2013.01); *H01L 23/5389* (2013.01); *H01L 2224/0401* (2013.01); *H01L 2224/484* (2013.01)

(58) Field of Classification Search
CPC ................ H01L 2924/00; H01L 2224/83192; H01L 2224/484; H01L 2224/4824; H01L 2224/0401; H01L 2224/32145; H01L 23/5389; H01L 2924/1517; H01L 2924/15153; H01L 2224/03; H01L 2924/15151; H01L 21/4857
See application file for complete search history.

(56) References Cited

U.S. PATENT DOCUMENTS

| | | | | |
|---|---|---|---|---|
| 5,157,475 A | * | 10/1992 | Yamaguchi | 257/784 |
| 5,571,608 A | * | 11/1996 | Swamy | 428/137 |
| 2007/0074899 A1 | * | 4/2007 | Aonuma et al. | 174/260 |
| 2009/0294162 A1 | * | 12/2009 | Jeong et al. | 174/260 |
| 2012/0091594 A1 | * | 4/2012 | Landesberger et al. | 257/774 |

* cited by examiner

*Primary Examiner* — Julio J Maldonado
*Assistant Examiner* — Farun Lu
(74) *Attorney, Agent, or Firm* — Che-Yang Chen; Law Office of Michael Chen (57) ABSTRACT

A method for mounting a chip on a printed circuit board (PCB) is disclosed. The method includes the steps of: providing a chip having a plurality of bonding pads and a PCB having a recess portion and a plurality of connectors; gluing the recess portion; placing the chip into the recess portion; and forming circuit patterns linking associated bonding pad and connector. A bottom of the recess portion is substantially flat and a shape of the recess portion is similar to that of the chip but large enough so that the chip can be fixed in the recess portion after being glued.

11 Claims, 10 Drawing Sheets

METHOD FOR MOUNTING CHIP ON PRINTED CIRCUIT BOARD

FIELD OF THE INVENTION

The present invention relates to a method for mounting a chip. More particularly, the present invention relates to a method for mounting a chip on a printed circuit board.

BACKGROUND OF THE INVENTION

A silicon chip, or integrated circuit (IC), is the core element of an electronic device and usually comes in packaged form. With the development of manufacturing technology and requirement of compact design for end products, various packaging methods were invented to meet the demand. At most of the time, silicon chips are sealed within a protection material such as epoxy resin. There are certain cases, particularly when the silicon chip is a sensor device such as a fingerprint sensor chip, that the silicon chip needs to be mount on a substrate and has the surface exposed. Meanwhile, for a fingerprint reader device, the thickness of the packaged sensor must be as low as possible. Hence, the technique of bonding the silicon chip to the substrate plays a very important role. The bonding needs to ensure good circuit connectivity formed therebetween, and to be rigid enough to sustain the fingerprint reader sensor with shear force exerted by a finger.

Flip chip technology is a suitable means for better interconnecting between the die and the PCB. Processing a flip chip is similar to the conventional IC fabrication, with a few additional steps. Please refer to FIG. 1. Near the end of the manufacturing process, the attachment pads 2 of a chip 1 are metalized to make them more receptive to solders. This typically consists of several treatments. Small dots of solder balls 3 are then deposited on each metalized pad 2. The chips 1 are then cut out of the wafer as normal. To attach the flipped chips 1 into a PCB 4, the chip (die) 1 is inverted to bring the solder balls 3 down onto connectors 5 on the underlying PCB 4. The solder balls 3 are then re-melted to produce an electrical connection, typically using a thermosonic bonding or alternatively using a reflow solder process. This also leaves a small space between the chip's circuitry and the underlying mounting. In most cases an electrically-insulating adhesive 6 is then underfilled to provide a stronger mechanical connection.

Figure 1:
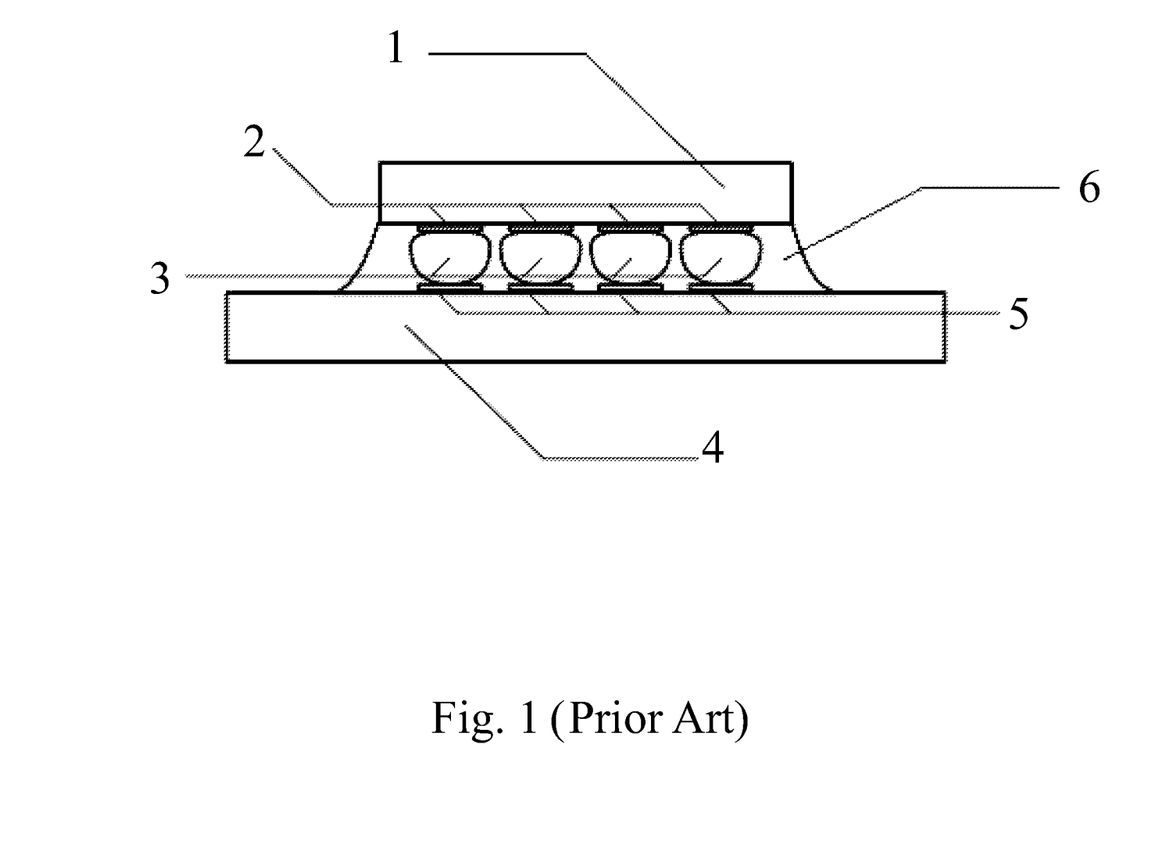
FIG. 1 is used to illustrate a conventional flip chip process.

One challenge of the flip chip technology is heat dissipation for thermal stress in the chip 1. The adhesive 6 is used as a heat bridge to ensure that the solder balls 3 are not stressed due to differential heating of the chip 1 and the PCB 4. The adhesive 6, distributing the thermal expansion mismatch between the chip 1 and the PCB 4, prevents stress concentration in the solder balls 3 which would lead to premature failure. When fan-outs of logic gates of a chip increases and associated pads for soldering become more and tiny, the efficiency of heating dissipation of such adhesive for the solder balls get worse. In other words, the tiny solder balls will easily get hurt to cause open-circuit failure since limited quantity of the adhesive applied to take away unnecessary heat. Meanwhile, for a fingerprint reader sensor chip, the binding ability between the chip and the PCB may not sufficient to resist the force exerted by a finger.

Figure 2:
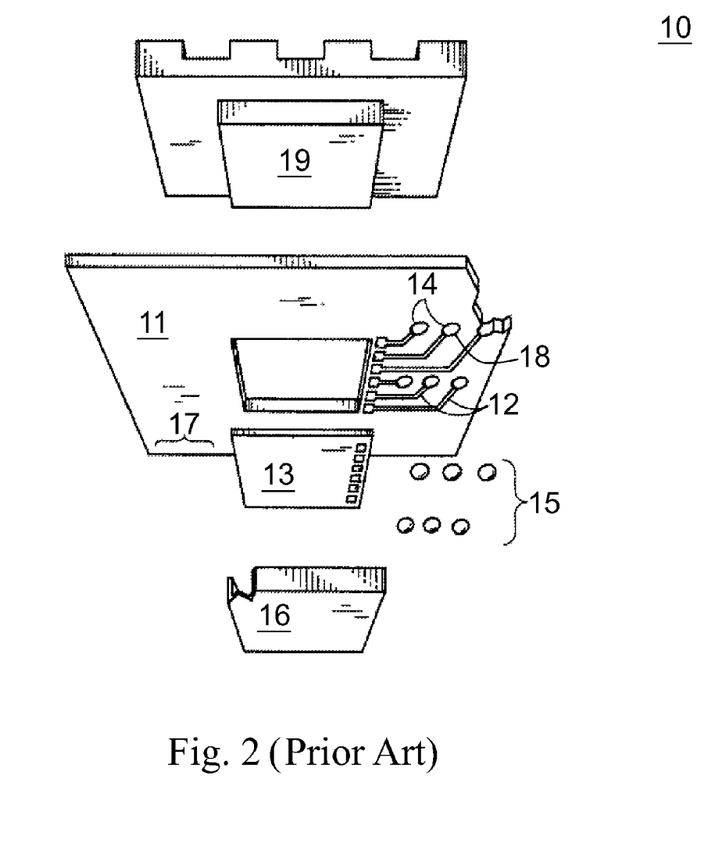
FIG. 2 shows an electronic pad array carrier IC device in a prior art.

A better solution to settle the problem could be available from the U.S. Pat. No. 5,045,921. Please see FIG. 2. An electronic pad array carrier IC device 10 for mounting on a PCB is disclosed. It has a thin and flexible "tape" substrate 11 which has a number of traces 12. The substrate 11 can withstand relatively large lateral mechanical displacement. An integrated circuit die 13 is mounted in proximity with or on the substrate 11. The substrate traces 12 are provided at their outer ends 14 with solder balls 15 for making connections to the PCB. A package body 16 covers the die 13. Alternatively, a carrier structure may be provided around the periphery 17 of the substrate 11 to add rigidity during handling, testing and mounting, but which may also provide the stand-off function. The thin, flexible substrate 11 can absorb a relatively large lateral or even vertical mechanical displacement over a rather large package area that may accommodate as few as 20 or as many 500 or more connections. The solder balls 15 may be joined to a via 18 through the substrate 11 at least partially filled with electrically conductive material to permit back side testing before or after mounting of a package to the PCB. Additionally, a heat sink structure 19 may be directly bonded to the die 13 in the pad array carrier IC device 10. Although '921 was an innovative invention to provide bonding between a die and a PCB with a special tape substrate, it is the tape substrate causes complexity in mounting and extra cost.

Therefore, an improved method for mounting a chip on a PCB is still desired. More particularly, the binding ability between the chip and the PCB should resist external force exerted onto the chip.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a method for mounting a chip on a printed circuit board (PCB) includes the steps of: providing a chip having a plurality of bonding pads and a PCB having a recess portion and a plurality of connectors; gluing the recess portion; placing the chip into the recess portion; and forming circuit patterns linking associated bonding pad and connector. A bottom of the recess portion is substantially flat and a shape of the recess portion is similar to that of the chip but large enough so that the chip can be fixed in the recess portion after being glued.

Preferably, the gluing step is achieved by a conductive adhesive. An auxiliary nonconductive adhesive is further placed over the conductive adhesive and in sealing the gap between the chip and edges of the PCB. The forming circuit patterns step is achieved by ink-jet or screen printing. A conductive ink or conductive paste is used for the ink-jet or screen printing. The PCB has at least 3 conductive layers and 2 insulation layers formed interleaved. The forming circuit patterns step is achieved by forming a layer of copper and etching out an unnecessary portion of the copper. The chip is an image sensor. The image sensor is a fingerprint reader sensor. Step difference between a level of a top surface of the chip and that of the PCB after the placing the chip into the recess portion step is less than 0.1 mm.

According to the present invention, the method further includes a step of forming a protection layer over the off-chip area. The protection layer is better made of organic coating material.

DETAILED DESCRIPTION OF THE PREFERRED EMBODIMENT

The present invention will now be described more specifically with reference to the following embodiment.

Figure 3:
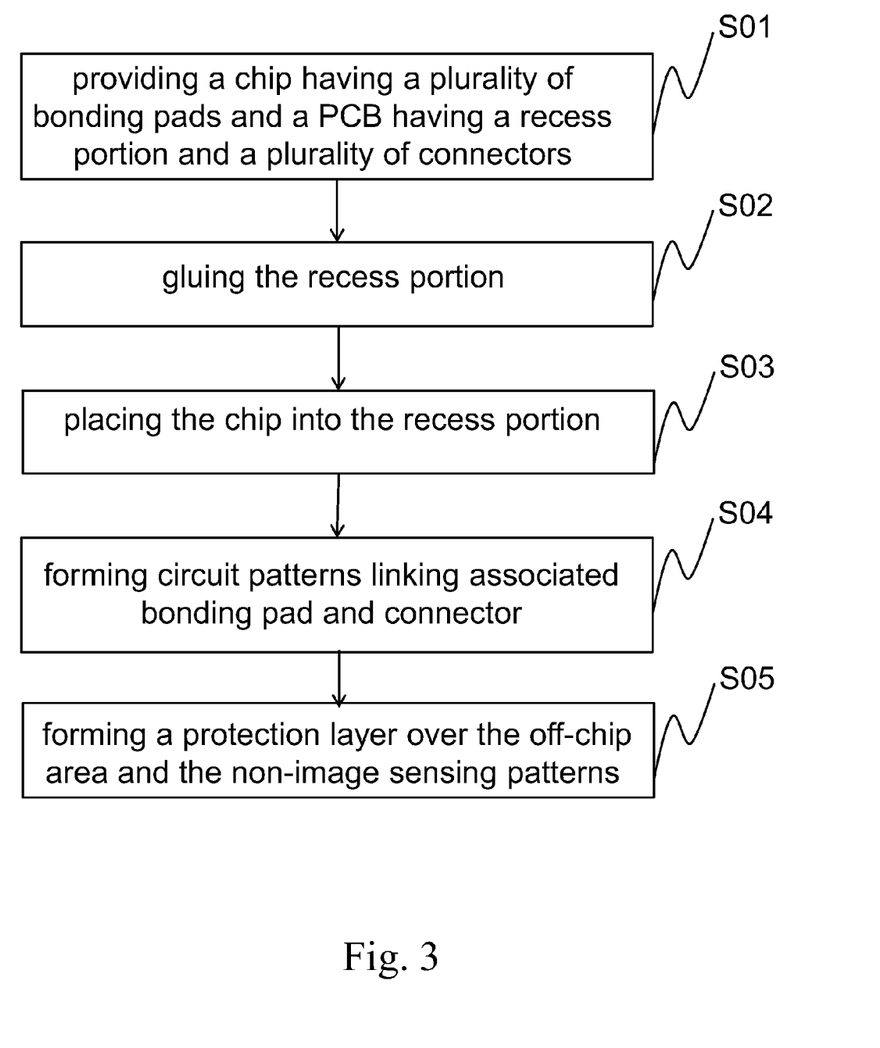
FIG. 3 is a flow chart of a method for mounting a chip on a printed circuit board according to the present invention.
Figure 4:
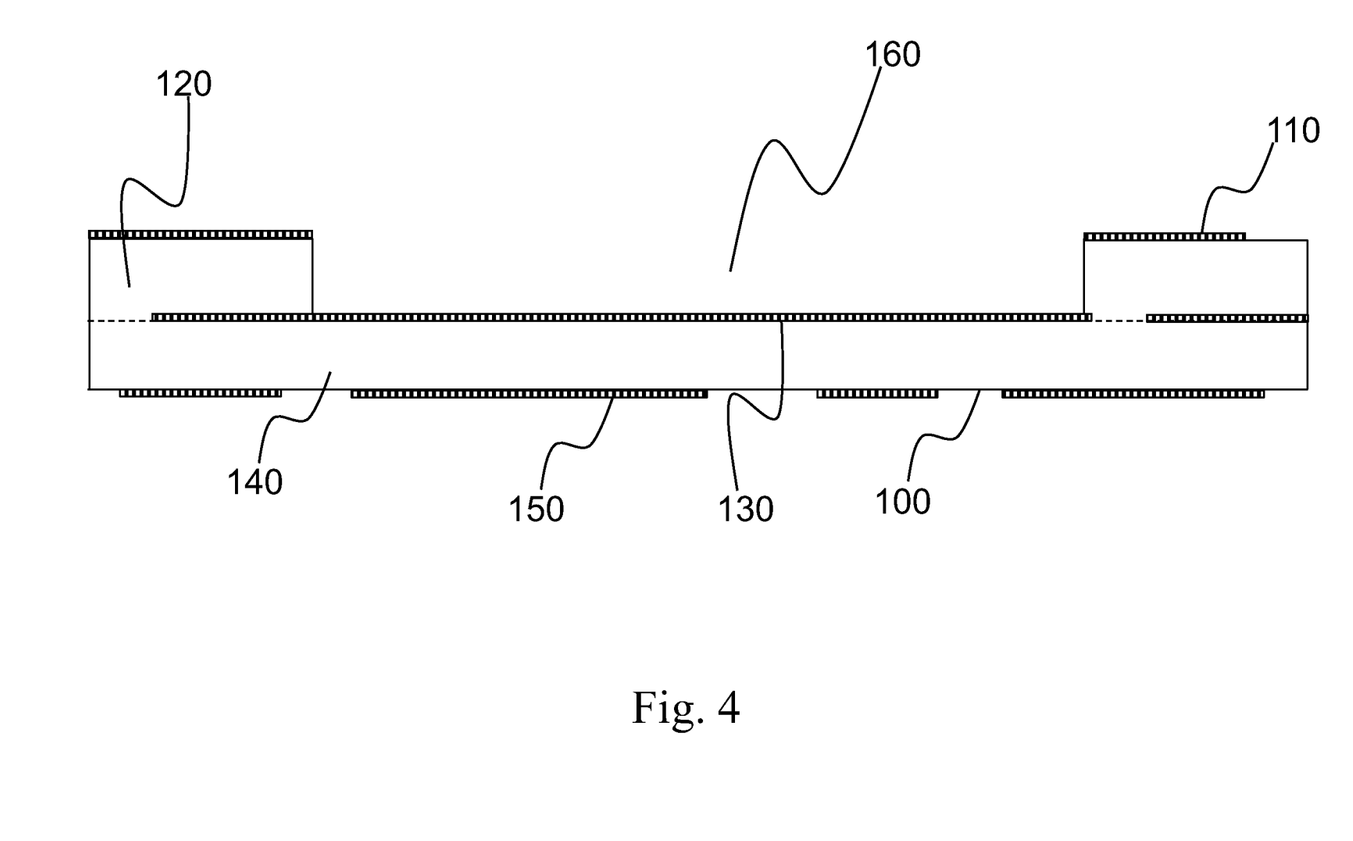
FIG. 4 to FIG. 9 illustrate steps of the method.
Figure 5:
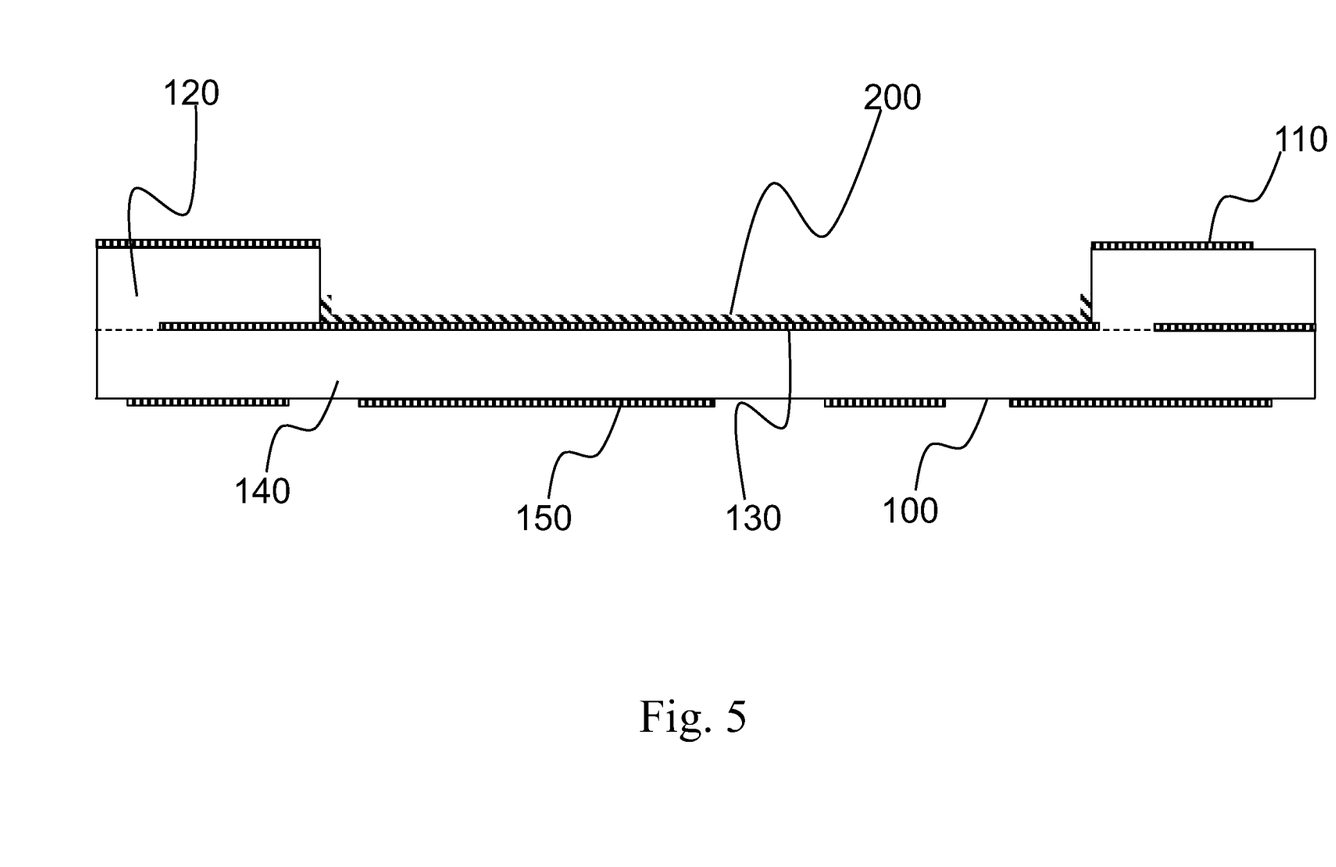
Figure 6:
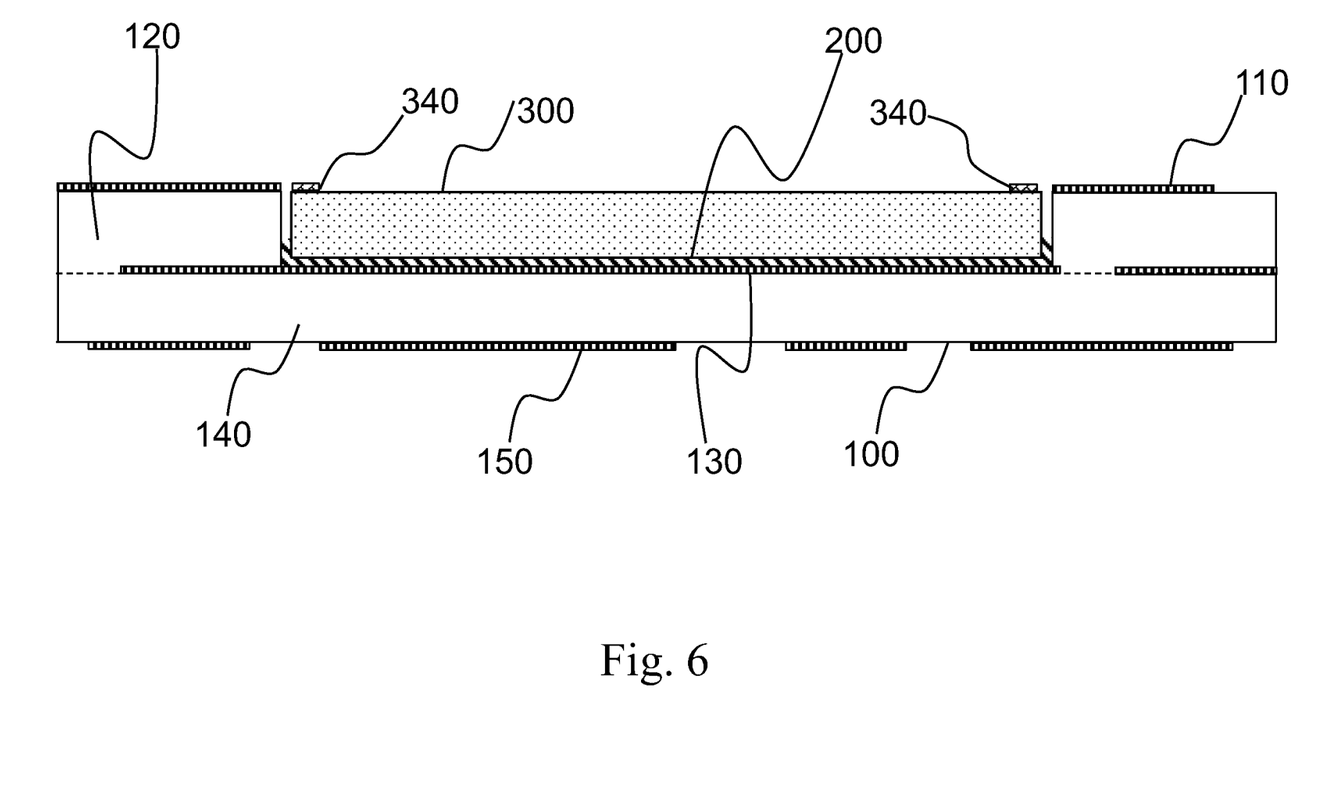
Figure 7:
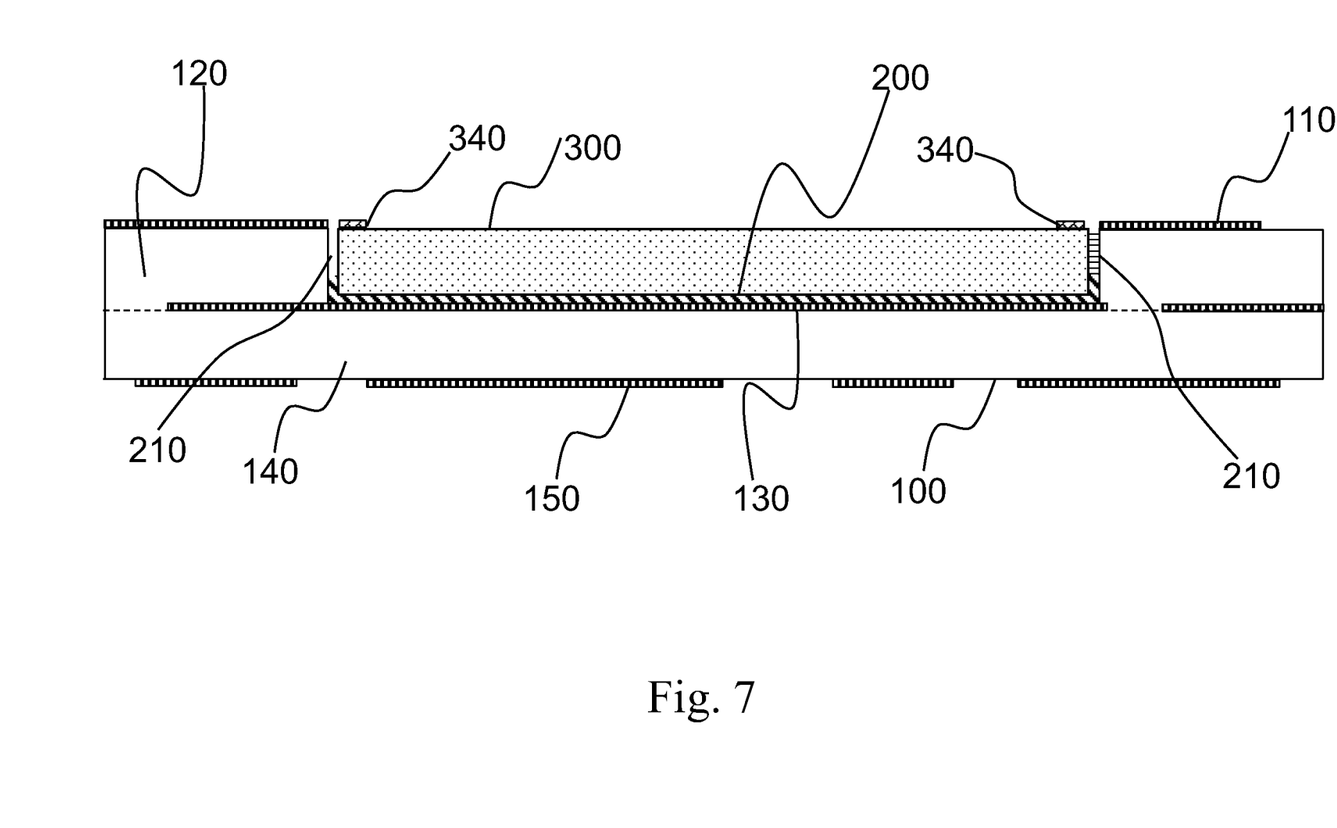
Figure 10:
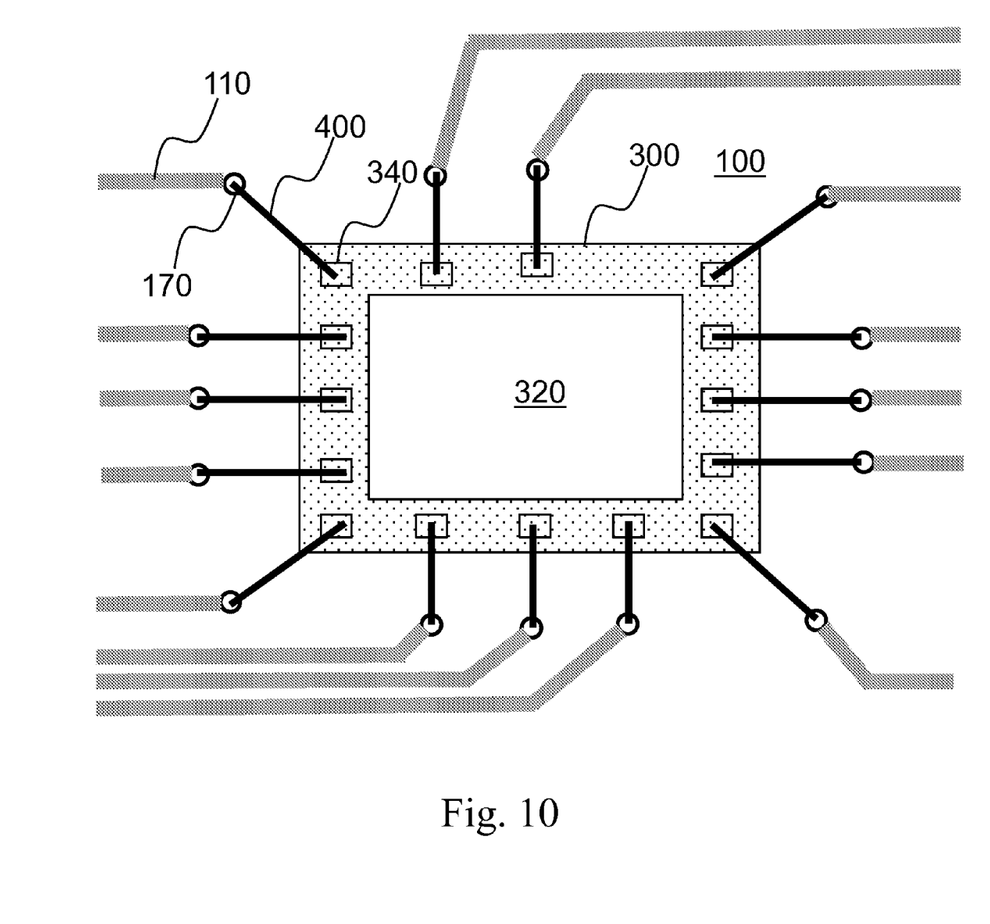
FIG. 10 shows a top view of the chip and the printed circuit board after the method has applied.

Please refer to FIG. 3 to FIG. 10. An embodiment is illustrated. FIG. 3 is a flow chart of the method for mounting a chip on a printed circuit board (PCB) according to the present invention. FIG. 4 to FIG. 9 illustrates steps of the method. FIG. 10 shows a top view of the chip 300 and the PCB 100 after the method has been applied.

The first step of the method is to provide a chip 300 and a PCB 100 (S01). According to the present invention, the chip 300 is in form of a die rather than a packaged integrated circuit. Without the package portion in a conventional packaged integrated circuit, the chip 300 can have lower thickness for assembly and is possible to reduce the thickness of a final product applied this chip 300. In application, the chip 300 is better an image sensor since it is not necessary to be enclosed for protection. Instead, image sensors must expose a portion of themselves to the external environment so that they can function normally. Moreover, some of them would be encountered extra forced exerted. Protection against friction should be well done. For example, the chip 300 in the embodiment is a fingerprint reader sensor chip in form of a die. Before further processes of the method of the present invention are applied, a layer of protection should be ready. Please refer to FIG. 10 first. From the top view of the chip 300, it is obvious that the chip 300 has a sensing portion 320 and a number of bonding pads 340 on the same side. In the embodiment, for illustrative purpose, there are fifteen bonding pads 340 used. In practice, the number of bonding pads 340 is not limited to fifteen. It can be more, for example tens to hundreds, depending on the fan-outs of its design. The bonding pads 340 are used to link to external circuitry for the fan-outs.

The PCB 100 can be any types except a flexible circuit board. According to the present invention, it is better to have at least 3 conductive layers and 2 insulation layers formed interleaved. Please refer to FIG. 4. The PCB 100 has a first conductive layer 110, a first insulation layer 120, a second conductive layer 130, a second insulation layer 140 and a third conductive layer 150. Each of the conductive layers forms a specified circuitry. There can be many vias (not shown) used to be filled with conductive material, such as copper. Vias can be used to conduct current between two or three conductive layers. The first insulation layer 120 and the second insulation layer 140 substantially block electrical connections for two adjacent conductive layers. Since each of the conductive layers may not be completely formed or populated to occupy the entire space between the first insulation layer 120 and the second insulation layer 140, there are some portions of the first insulation layer 120 and the second insulation layer 140 contacted with each other. For illustration purpose, dashed lines are used to separate the two insulation layers. In fact, the interface is not so clear.

It is appreciated that the illustration of the PCB 100 comparing with other components in all figures is not in proportion. In order to have a better understanding of the present invention, length and thickness of the PCB 100 comparing with other components are shrunk. In practice, the PCB 100 would be much wider than it is shown in FIG. 4 to FIG. 9. It is not necessary a limit to the scope of claims of the present invention. The PCB 100 has a recess portion 160 which may be formed by cutting a portion of the first insulation layer 120. A bottom of the recess portion 160 is substantially flat and formed by the second conductive layer 130. A shape of the recess portion 160 is similar to that of the chip 300 but large enough so that the chip 300 can be fixed in the recess portion 160 after the chip 300 gets glued in the coming step. The first conductive layer 110 has a number of portions which are used to link to the related bonding pads 340, so that a complete circuitry run as a sensor can be implemented after all linkages between that portions and the bonding pads 340 are formed.

The next step is gluing the recess portion 160 (S02). Please see FIG. 5. A conductive adhesive 200 is used for gluing. Preferably, the conductive adhesive 200 is a silver paste. The reason the conductive adhesive 200 is used is the chip 300 and the PCB 100 need to be fixed while electrical conductivity must exist therebetween. Actually, the amount of the conductive adhesive 200 is not as much as the figures show as long as the PCB 100 and the chip 300 can be glued. Then, place the chip 300 into the recess portion 160 (S03). Please see FIG. 6. After the chip 300 is placed on the conductive adhesive 200, there might be space where the conductive adhesive 200 is not filled. The space forms a gap between the chip 300 and edges of the PCB 100. An auxiliary nonconductive adhesive 210 is further used to place over the conductive adhesive 200 and in the gap. Please refer to FIG. 7. Heat conductive glues are preferred to be used as the auxiliary nonconductive adhesive 210. Epoxy resin is recommended.

It should be noted the step S03 is not soon after the step S02. It should be time to wait for the conductive adhesive 200 becoming the maximum stickiness before it is fixed. It should be noticed that a level of a top surface of the chip 300 may be substantially the same as that of the PCB 100 after step S03 is finished. This is because the two top surfaces must be closer enough for the next step to be applied so that circuitry formed across the two surfaces would not be damaged due to a large step (or difference of height) formed therebetween. In practice, step difference between the level of the top surface of the chip 300 and that of the PCB 100 after step S03 should be less than 0.1 mm. The chip 300 could be a slightly higher than the PCB 100 since the chip 300 may be enclosed by a housing (not shown) but the sensing portion 320 must be exposed through an opening.

Figure 8:
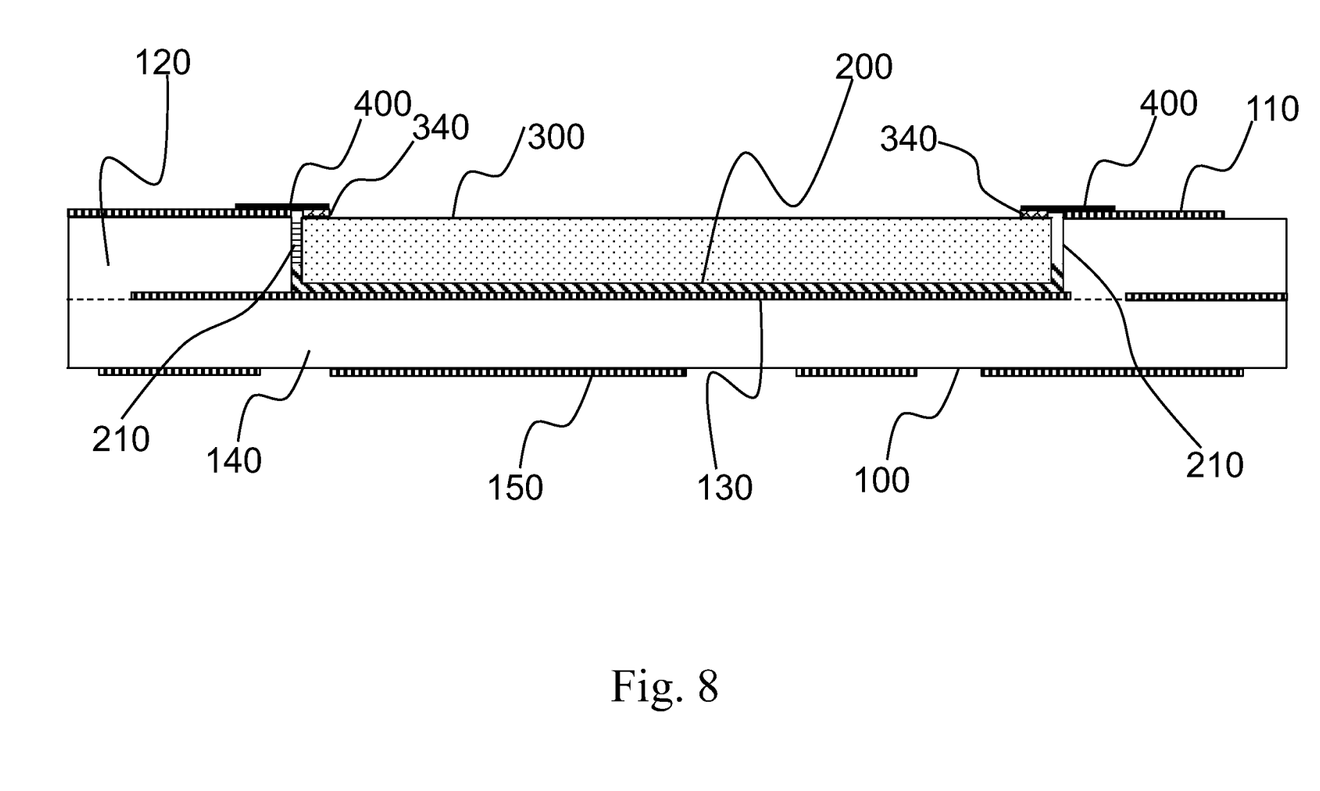
Figure 9:
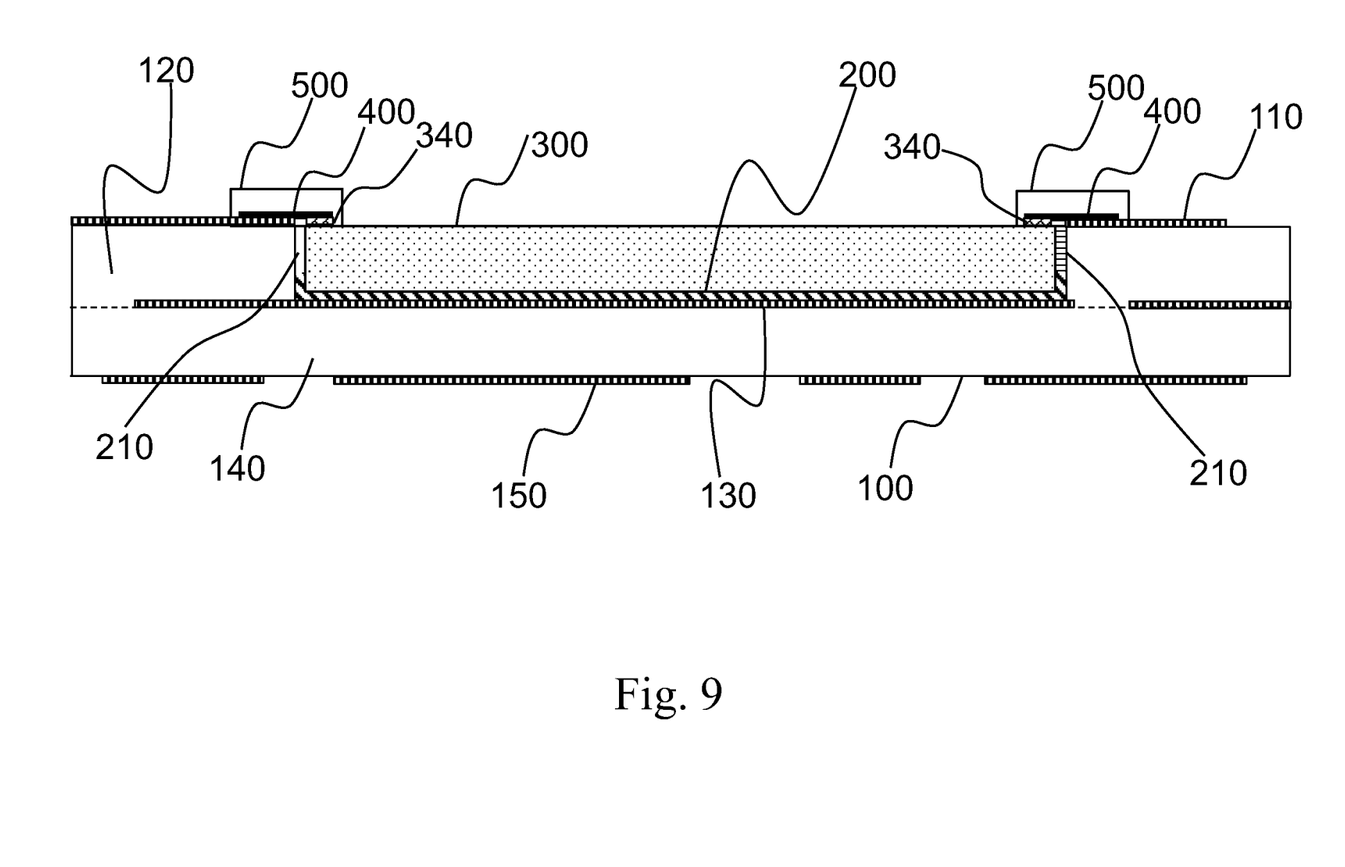

Next step is forming circuit patterns 400 linking associated bonding pad 340 with connector 170 (S04). It is depicted by FIG. 8. This step is achieved by inkjet printing or screen printing. However, the ink used here should be specified. It is a conductive ink used for the inkjet printing or screen printing. The conductive ink contains conductive materials. After it is dried, circuit connection can be available by the conductive materials left as the circuit patterns 400. The circuit patterns 400 can be formed by other means. For example, it is achieved by forming a layer of copper and etching out an unnecessary portion of the copper. In addition, the conductive ink, can be replaced by a conductive paste if further fixtures are used over the bonding pad 340.

Mounting of the chip 300 on the PCB 100 can be ready after the aforementioned steps. However, according to the spirit of the present invention, the method can further comprise a step to form a protection layer 500 over the off-chip and the non-image sensing area (S05). Please refer to FIG. 9. This is because the left conductive materials of the conductive ink (paste) may not be wearable. In order to protect the circuit patterns 400, the protection layer 500 exists. Preferably, the protection layer 500 is made of organic coating material.

From the description of the embodiment above, it is known that there are some features of the present invention comparing with conventional methods. First, the recess portion 160 in the PCB 100 is just large enough to accommodate the chip 300 and the conductive adhesive 200. After gluing, the chip 300 can be firmly fixed in the PCB 100. The chip 300 can resist the force exerted by the finger for fetching fingerprint image patterns with the help of the conductive adhesive 200 and the reaction from the PCB 100. Second, no soldering is applied to form the circuitry across the chip 300 and the PCB 100. No more problems of heat dissipation could happen.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A method for mounting a chip on a printed circuit board (PCB), comprising the steps of:
   providing a chip having a plurality of bonding pads and a PCB having a recess portion and a plurality of connectors;
   adding glue into the recess portion;
   placing the chip into the recess portion of the PCB; and
   linking the bonding pads to the connectors of the PCB by inkjer printing or screen printing to form circuit patterns,
   wherein a bottom of the recess portion is substantially flat and a shape of the recess portion is similar to that of the chip but large enough so that the chip can be fixed in the recess portion of the PCB after the glue is being added; and
   wherein step difference between a level of a top surface of the chip and that of the PCB after the placing the chip into the recess portion step is less than 0.1 mm.

2. The method according to claim 1, wherein the gluing step is achieved by a conductive adhesive.

3. The method according to claim 2, wherein an auxiliary nonconductive adhesive is further placed over the conductive adhesive and sealing a gap between the chip and edges of the PCB.

4. The method according to claim 1, wherein a conductive ink is used for the inkjet printing or screen printing.

5. The method according to claim 1, wherein a conductive paste is used for the inkjet printing or screen printing.

6. The method according to claim 1, wherein the PCB has at least 3 conductive layers and 2 insulation layers formed interleaved.

7. The method according to claim 1, wherein the forming circuit patterns step is achieved by forming a layer of copper and etching out an unnecessary portion of the copper.

8. The method according to claim 1, wherein the chip is an image sensor.

9. The method according to claim 1, wherein the image sensor is a fingerprint reader sensor.

10. The method according to claim 1, further comprising a step of forming a protection layer over an off-chip area.

11. The method according to claim 10, wherein the protection layer is made of organic coating material.

* * * * *